United States Patent [19]
Doherty

[11] 4,152,642
[45] May 1, 1979

[54] SIGNAL ANALYSIS

[76] Inventor: Leslie E. Doherty, 8 Lambrook St., Elizabeth West, S.A. 5113, Australia

[21] Appl. No.: 823,391

[22] Filed: Aug. 10, 1977

[30] Foreign Application Priority Data

Aug. 16, 1976 [AU] Australia .............................. PC 6997

[51] Int. Cl.$^2$ ........................................... G01R 23/16
[52] U.S. Cl. .................................. 324/77 A; 328/116
[58] Field of Search ............... 324/77 R, 77 A, 103 P, 324/133; 328/116, 117; 307/235 C, 235 P

[56] References Cited

U.S. PATENT DOCUMENTS

| | | | |
|---|---|---|---|
| 2,779,869 | 1/1957 | Gerks | 324/77 A |
| 3,360,723 | 12/1967 | Royce | 324/77 A |
| 3,422,349 | 1/1969 | Makino | 324/77 A |

*Primary Examiner*—M. Tokar
*Attorney, Agent, or Firm*—Kinzer, Plyer, Dorn & McEachran

[57] ABSTRACT

A method of signal analysis in which the signal in digital form has range values and domain values at successive turning points of range values stored in a memory; upon the signal passing through a penultimate stored value of range, the last two stored values of range and associated domain values are extracted for separate use and are deleted from the memory and hence from subsequent comparisons.

10 Claims, 8 Drawing Figures

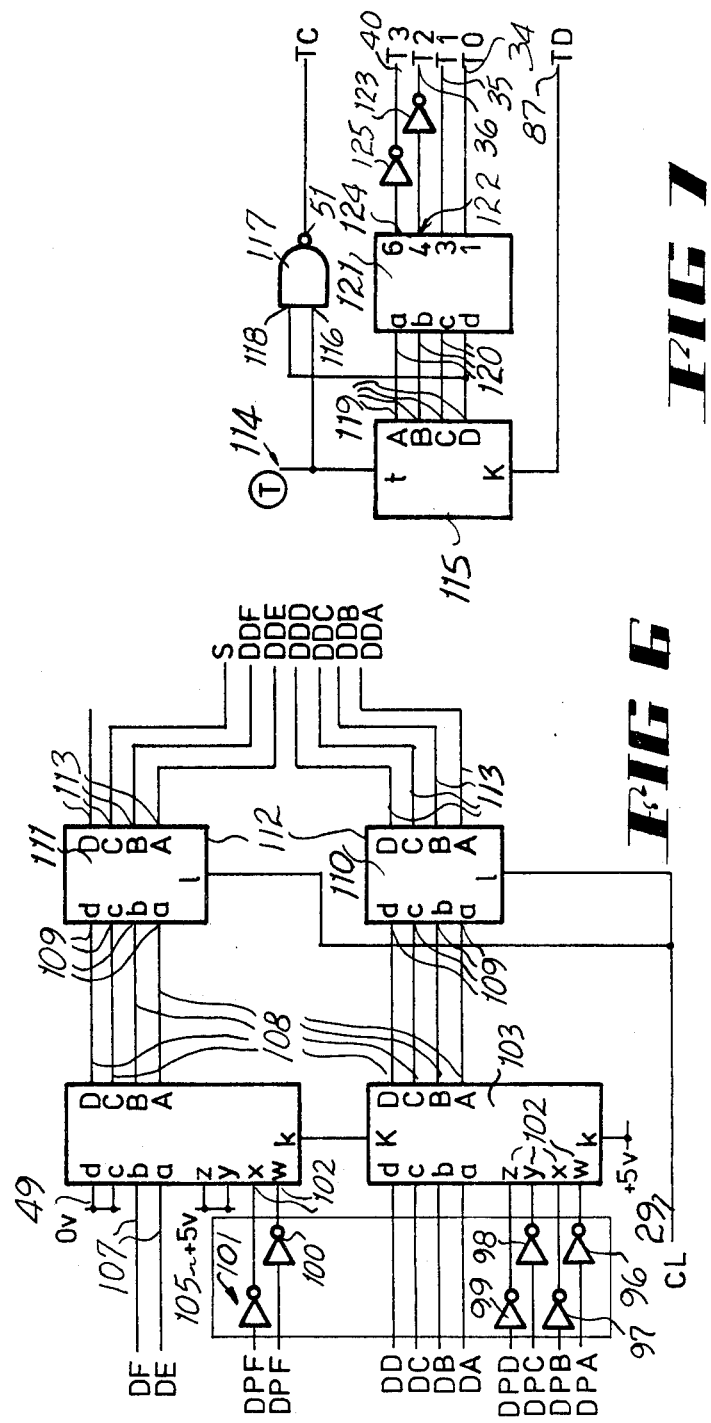

SIGNAL ANALYSIS

This specification relates to improvements concerning signal analysis.

BACKGROUND OF INVENTION

I have previously developed apparatus for detecting and monitoring range pairs with relation to an input signal.

Such a method, and the apparatus to effect the method, was useful in recording some of the factors affecting the fatigue life of metal, and the method and apparatus was accordingly considered useful in relation to that application.

There are of course a number of differing ways of comparing maxima and minima for an assessment of fatigue cycles, and those that have been considered include comparing a maximum peak to a minimum trough, with a range count between successive peaks and troughs in which two equal ranges, traversed in opposite directions, are paired to form one cycle or of course a range pair cycle.

Previous work therefore has consisted of considering a best method for assessment of fatigue damage by detection of certain happenings in relation to the metal, and a method and apparatus has been developed which is of use in recording one characteristic of such happenings in relation to the limited application of fatigue measurement of metals.

OBJECT OF INVENTION

One object of this invention is to provide a method of analysis of a selected signal which provides additionally useful information and provides a method which can be achieved in a manner which may require equipment of less complexity or equipment that is less expensive than has hitherto been the case and indeed provide a method of signal analysis which even with equipment of lesser complexity and cost can give valuable results.

STATEMENT OF THE INVENTION

By simply detecting range pairs from a selected signal there has been some value in relation to fatigue analysis of materials.

It has been discovered, however, that if domain values such as time are associated with the turning points (extrema) detected in the range pair analysis, and particularly if the domain values, equivalent to the respective turning points for each selected range pair, are extracted at the same time as the range pair information, then the method becomes a very powerful method in relation to signal analysis and becomes effective for a number of applications.

A feature of the invention therefore is to associate domain values such as time with turning points in the range values and interpreting and calculating information from such values as shall subsequently be described.

According to one form of the invention, then, it can be said to reside in a method of analysis of a signal which includes a succession of turning points, comprising the following steps:

A. establishing a series of discrete range values for the signal to be analyzed;

B. storing information identifying the discrete range value for each successive turning point, in association with a domain value for that turning point, in a turning point memory;

C. continuously comparing the penultimate stored turning point range value with the present range value of the input signal;

D. upon detection of a range value equality in step C, storing a range pair constituting the ultimate stored turning point range value and the penultimate stored turning point range value, in a range pair memory;

E. concurrently with recording of the range pair, in step D, storing a domain pair constituting the domain values associated with the ultimate and penultimate stored turning point range values, in a domain pair memory;

F. removing the turning point range values relating to the range pair from subsequent comparison; and G. continuing the foregoing procedure for each turning point and range pair in the input signal.

The invention can even be said to reside in a wider conceptual arrangement, for instance, including the method for analyzing a series of events having a plurality of levels of occurrence, comprising the following steps:

A. associating signal vectors with the occurrence of events at said plurality of levels;

B. detecting extrema (e.g., turning points) in the signal vectors;

C. establishing a domain value for each of such extrema in the signal vectors;

D. recording each of the extrema, together with its domain value, in a LIFO memory;

E. detecting each occurrence of a signal vector equal to the penultimate recorded extremum vector;

F. upon detection of an equality in step D, recording a subset comprising said penultimate extremum vector and an immediately adjacent extremum vector from the LIFO memory, and their domain values, in an additional memory, and deleting that subset from the LIFO memory.

The term "range" is used throughout this specification to indicate, as a most general definition, a value of a signal in relation to one particular domain value and it is generally understood that the range value for an incoming electrical signal would be the amplitude of that signal and the domain value would be the time which would determine the amplitude at that given instant.

The term "domain" therefore is used as a more general definition although it is once again understood that the most common application of the concept is where the domain values are in fact values of time and indeed the preferred embodiment will be described in relation to this particular application.

This assumes however that the application of the method is wider than a limitation to simply amplitude variation with reference to time and hence the use of the two terms which are more general, that is "range" and "domain".

With an incoming electrical signal varying in amplitude with relation to time it is preferred that the method be related to digital analysis techniques and therefore the amplitude of the signal is first divided into a series of digital values, the digital value in fact reflecting the range of amplitude of the incoming signal, each range then being identified by a discrete number which can be recorded and handled conveniently in digital equipment.

In the same way, time is divided into a series of clock pulses which are inherently of digital character, and once again each clock pulse can be identified in terms of a digital value which, indicates a range of time which being identified digitally, can be handled by digital devices.

Having the conversion into digital measurement of a continuous incoming signal, then, a range pair is sensed by recording turning points of the input signal preferably in a memory generally of a type in which the last signal in will be the first out, which is hereinafter referred to as a "LIFO" memory.

A range pair, which happens to be then the last two entries remaining in the LIFO memory, is detected when the penultimate entry remaining in the LIFO memory is equal in value to the current digital value of the input signal.

A feature of this invention is to couple with each entry in the LIFO memory storing the turning points of the input signal, the domain value associated with the range value, such as time, and this is preferably stored in a similar LIFO memory, and by being identified and therefore in some way tagged with identification with the appropriate range value, subsequent processing can be of substantial advantage in analysis of the signal.

Accordingly, according to the method, when a range pair is detected then an indication of validity is given and both the range and the domain pairs are removed from the LIFO memory and can either be further analysed or separately stored or made to effect further actions upon identification.

There is substantial further value in detecting the differential value between respective domain values of a range pair.

By using this range pair determination of differential domains, it is now possible to effect a very simple frequency analysis of a signal.

Because the range pair analysis couples the highest maximum with the lowest minimum and so on by associating a time with these turning points, it is possible to associate a time difference between range pairs of similar differential ranges.

There is advantage in the method furthermore in providing means to ignore slight perturbations by for instance ignoring any range pair effective over a less than selected range value, which of course can be preselected in the apparatus, and furthermore the analysis does not look at the wave shape per se but simply at the turning points. There is therefore a tendency to ignore higher frequencies in the signal which, however, are only distorting the wave form and not causing measurable turning points.

This to some extent is a simplifying of the analysis, but it has been found to have substantial practical value where a simple reading of certain characteristics of the signal is necessary.

DESCRIPTION OF PREFERRED EMBODIMENT

The invention itself will be better understood with reference to the accompanying description of a preferred embodiment, and reference should be made in understanding this invention also to the claims accompanying this specification.

Figure 1:
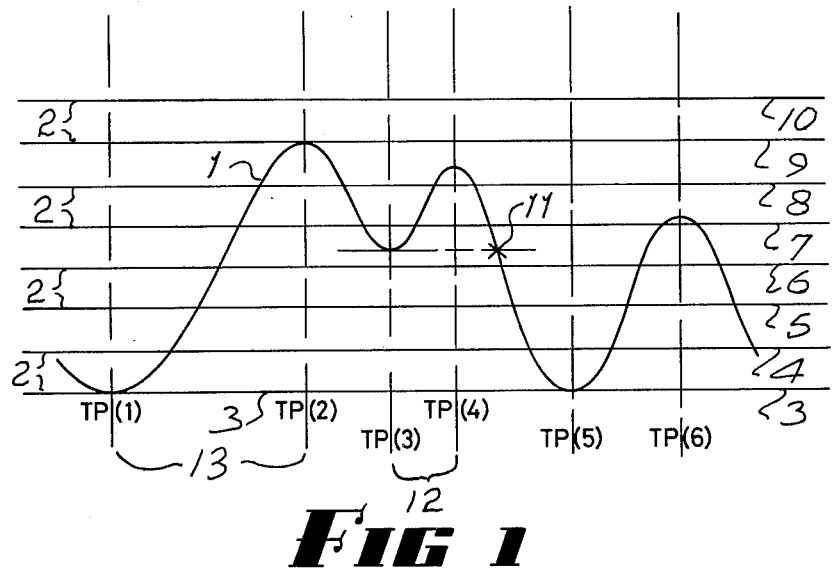
Figure 2:
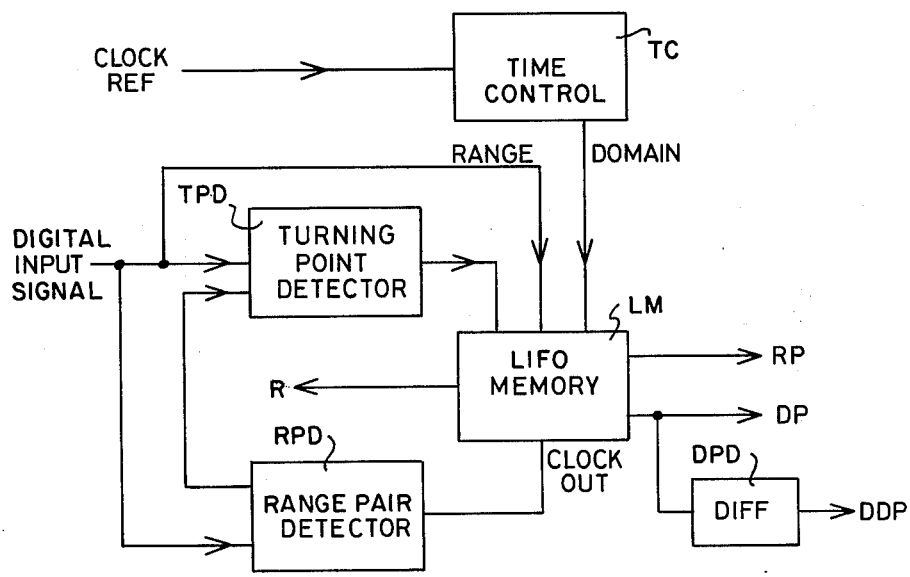
Figure 3:
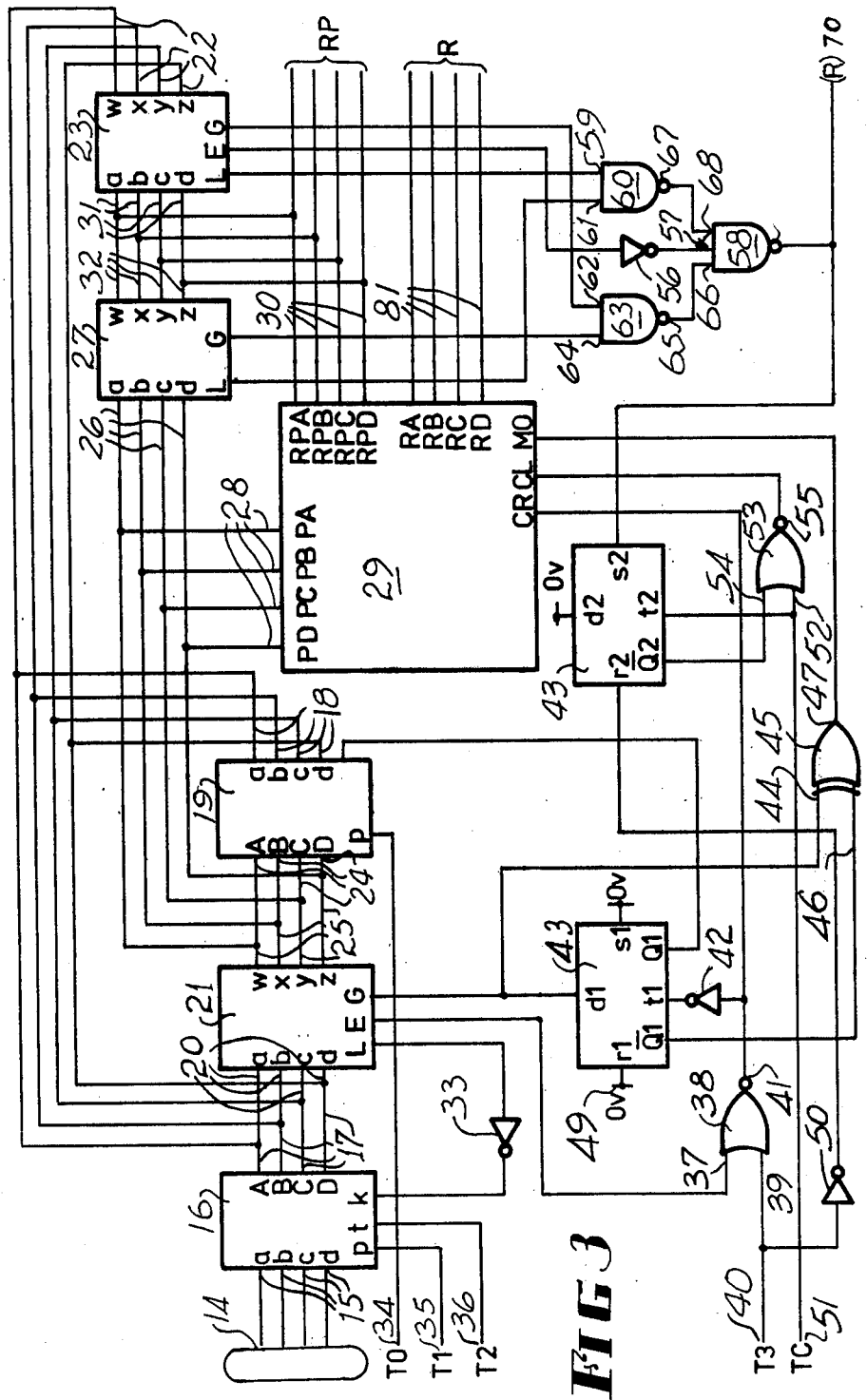
Figure 4:
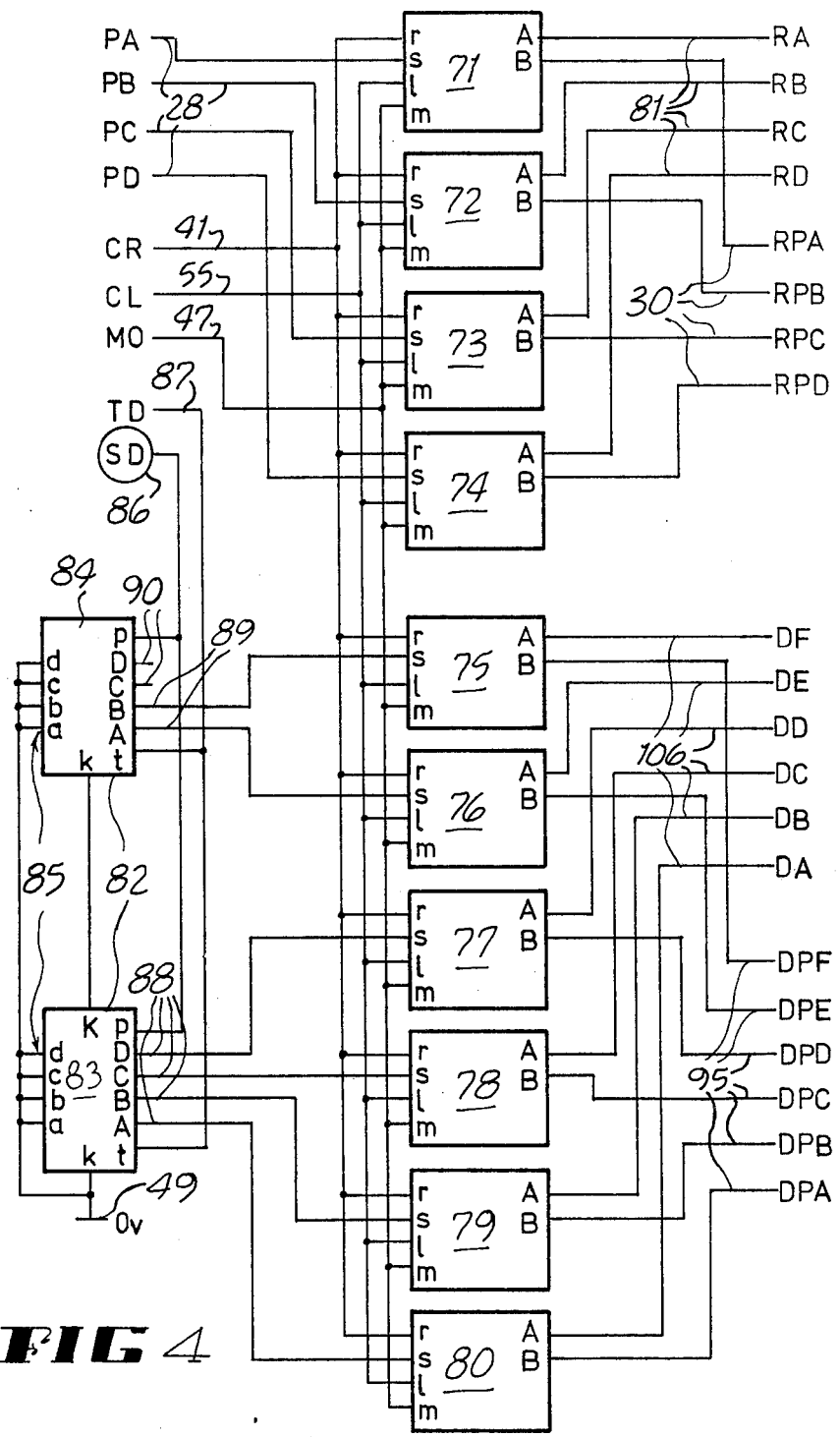
Figure 5:
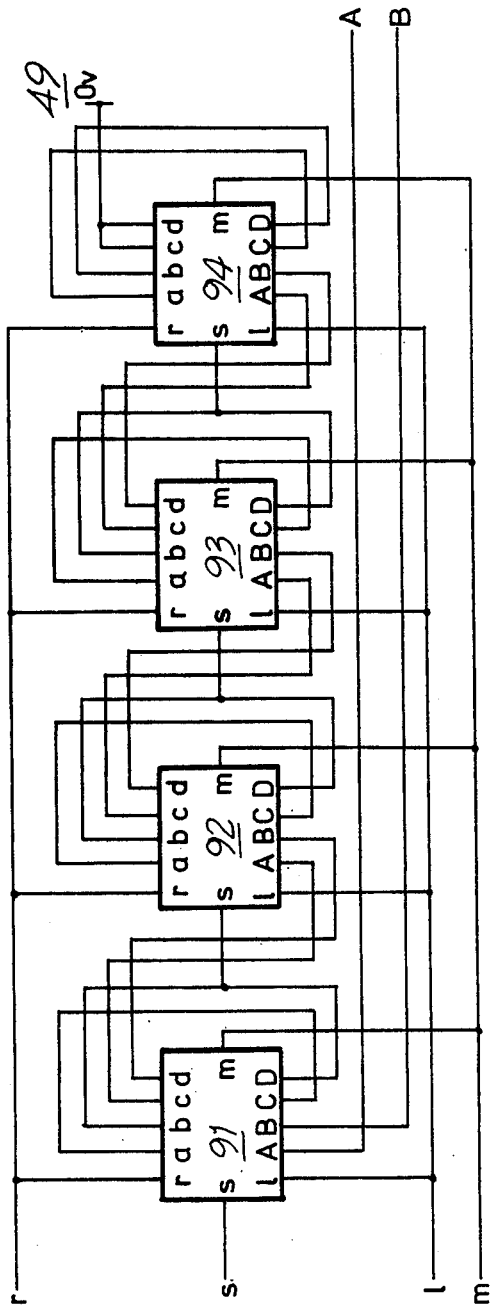
Figure 8:
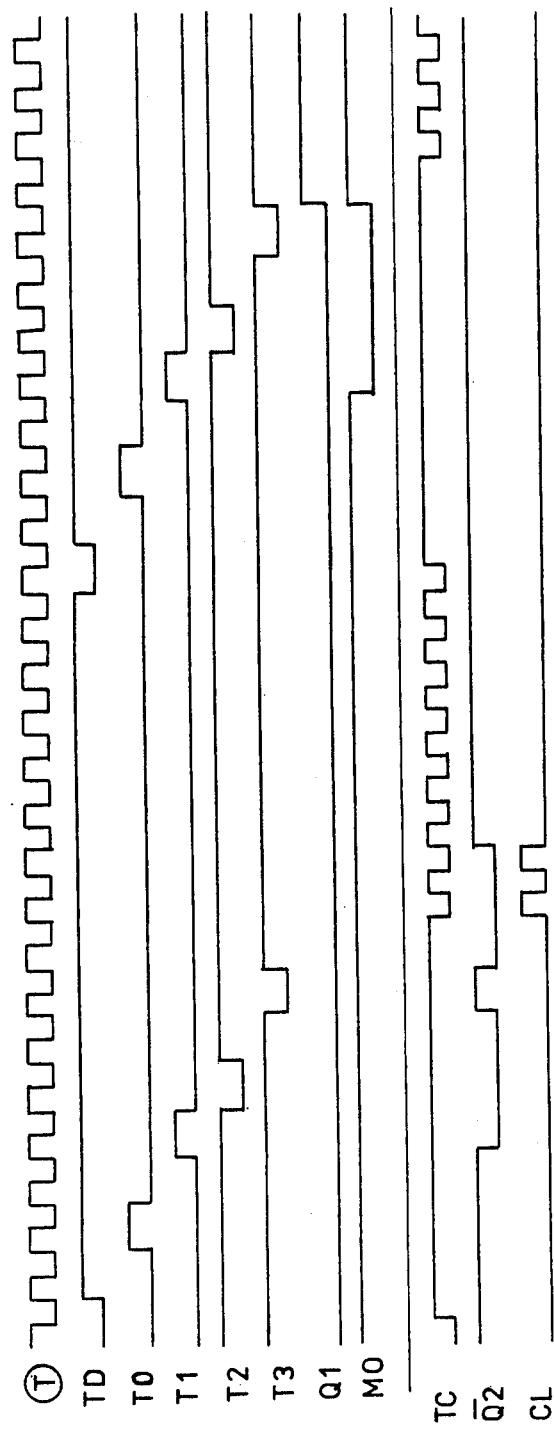

In relation to the embodiment this is described with the assistance of drawings in which:

FIG. 1 shows a graphical representation of a typical input signal and references are made to turning points and this will assist in generally explaining the principle behind the present invention, FIG. 2 is a block layout setting out the major functional blocks and interconnections of apparatus used for carrying out the method of the invention, FIG. 3 is a circuit diagram for analysing and extracting range pairs from an incoming electrical signal, FIG. 4 is a circuit diagram illustrating the connection of commercially available integrated circuits coupled to effect a combination of a LIFO memory and domain generator, FIG. 5 is a circuit of portion of the arrangement as shown in FIG. 4 particularly showing the LIFO memory portion, FIG. 6 illustrates in more detail the interconnection for commercial integrated circuits for a differential domain generator, FIG. 7 is a circuit of a timing generator according to this embodiment, and FIG. 8 illustrates some of the signals received in connection with each of the parts of the circuit showing the analysis sequence.

Referring now in detail to the drawings reference is first made to FIG. 1.

There is here shown a purely random input signal 1 represented by a line and this is shown as passing through a sequence of turning points (extrema) which are referred to and are located by the references "TP(1) ... TP(6)".

These correspond to turning points which in turn are equated to a range of levels which can be detected by using horizontal reference lines 2. Each of these horizontal reference lines 2 can be used to indicate a discrete value and for ease of reference decimal references shall be used although in practice the breakup may be binary and references may be preferably hexidecimal or otherwise.

Accordingly, it will be seen that the signal first reaches the lowermost turning point TP(1) which is detected and recorded in a LIFO memory at a range level 3, and the signal then rises to reach upper range level 9 at which a turning point will be detected and and recorded as TP(2). The signal then becomes of lower amplitude and passes below the range level 7 to TP(3) at which a turning point is detected and recorded although of course the digital value will be 7. The signal then rises to TP(4) and then proceeds downwardly passing through a level shown at X which corresponds to the penultimate recorded turning point level TP(3). The range levels at TP(3) and TP(4) are extracted from the LIFO memory. This then leaves the range value at TP(2) the last value in the memory and indeed leaves TP(1) as the one before last value or the penultimate value. It will be seen that as the signal then proceeds downwardly to TP(5) once again equality in level will be detected at range level 3 and the range levels at TP(2) and TP(1) will be extracted from the memory and stored.

Perhaps more importantly now there will be recorded a time associated with TP(3) and TP(4) and a differential time shown as 12 which will in fact identify a characteristic of the signal referred to as a domain value.

Likewise upon the range pair value associated with TP(1) and TP(2) being taken, a differential time or domain reference referred to as 13 in the drawing is taken and once again this information is of substantial value.

So it will now be seen that by using the range pair analysis technique sequentially signals having the smaller turning point range differences will be sequentially extracted so leaving selectively range pairs of progressively large difference in value.

Moreover, simply because the signal is converted into a digital signal, depending of course upon the range of digital values allowed for any particular signal, there will be potential for being able to simply ignore the very small variations in signal level and turning points associated therewith simply by selecting a coarser digital range and hence noise can be in a very effective way reduced or the interference effects from noise can be reduced.

It is to be noted that in practice, where there is a noncontinuous signal input, the apparatus can be made to respond to a continuous extrapolation between the levels of signal between the discontinuity so the discontinuity in itself need not be a substantial difficulty.

FIG. 2 is generally self explanatory to those familiar with the art although the drawing is useful to explain once again the general method incorporated in this invention.

There is an electrical signal which is converted into a digital input signal which is fed into a turning point detector TPD and at the same time is fed directly into a memory LM and also into a range pair detector RPD.

The memory LM is of a type having a LIFO storage type arrangement.

The storage, however, is activated in response to a clock reference acting through a time control device TC and this being activated firstly upon storage N by the turning point detector TPD and by outputting the storage references upon activation of the range pair detector RPD.

The output of the memory LM is out along the lines RP being of course range pair, and DP being domain pair and the DP output is further fed into a device DPD which calculates the differential between the collective domain pairs corresponding to the range pairs.

The clock references into the memory LM are of course pulses which inherently digitalize the domain (time) references, and because the clocking of the memory is on the same clock reference as the domain references, there is a synchronous response. There is therefore inherently a connection between the domain and range pairs so that the memory LM can simply be arranged to measure the domain value at the time of detecting a turning point and then simply outputting a domain value at the same time as outputting a range value, and these will be associated inherently by the synchronous activation.

There is a further technique available to reduce instability in measuring the range pair values where there might be small noise perturbations. This can be alleviated simply by adding a value of one consistently to the analogue values in a descending sequence; alternatively, a value of one may be subtracted from the analogue generated numbers in an ascending sequence.

As a simple illustration of the manner, in which this would be effective, one can take a series of digital range values e.g. 998989888787877 which would produce two range pairs (8,9) and three range pairs (8,7) while the main trend of the signal was really only slowly changing from 9 down to 7. If the perturbations are of negligible interest and are considered as simply a noise level to be avoided, then by applying the addition of one to the analogue generated numbers in a descending sequence we get 999999999888888.

A further practical convention can simplify the design and that is that the most negative number possible is 0 (one if one is added to descending numbers). That is, a sign bit of 0 is used for negative numbers if bipolar signals are envisaged.

This is a desirable feature which does simplify the practical range pair analysis circuit and most analogue to digital converters such as that commercially known as "ADC 414" have this output mode as an alternative.

Now I refer to the detail description.

The preferred embodiment of the invention uses integrated circuits manufactured by the "National Semiconductor Corporation", 2900 Semiconductor Drive, Santa Clara, Calif.; all type numbers quoted in this specification are those designated by the manufacturer.

In the drawings, imputs to the integrated circuits have been allocated small letters, outputs have been given capital letters. Functional block inputs and outputs have been designated by capital letters. Further, parallel binary digits are implemented by several parallel connections, the significance of the digits is indicated by the alphabetic order of the letters used; "B" being more significant than "A", e.g., a four bit binary output may be indicated by "A,B,C,D"; "A" refers to the least significant digit, "D" to the most significant digit. Where two binary numbers are the inputs to an integrated circuit the "A" input is designated "a,b,c,d" and the "B" input is designated by a different series, "w,x,y,z" ("w" is the least significant). Similarly, suffixes to block input and output references indicate significance, e.g., "RPA, RPB, RPC and RPD" indicate four digits of the binary output "RP". Where several binary numbers apply to a block they have different prefixes.

Referring to FIG. 3 an analogue input signal is converted to binary coded electrical signals by an analogue to digital converter of common type which is not shown. The binary coded input 14 is connected to "jam" inputs 15 of an integrated circuit 16 type CD4029C configured as a binary up counter. Outputs 17 of integrated circuit 16 are connected to "jam" inputs 18 of an integrated circuit 19 type CD4029C, configured as a register. Outputs 17 are also connected to "A" inputs 20 of a magnitude comparator 21 type MM74C85 and to "B" inputs 22 of a magnitude comparator 23 type MM74C85. Outputs 24 of integrated circuits 19 are connected to "B" inputs 25 of magnitude comparator 21 and also to "A" inputs 26 of 27, a magnitude comparator type MM74C85, and the "P" inputs, 28 of the memory 29. RP outputs 30 of memory 29 are connected to "A" inputs 31 of magnitude comparator 23 and "B" inputs 32 of comparator 27. The "A less than B" output, 21L, is connected through an inverter 33 to 16k, an enable input. Timing pulse "T0", 34 is connected to preset input, 21p; "T1", 35 is connected to a preset input, 16p and "T2" 36 is connected to clock input 16t. An "A equals B" output, 21E, is connected to one input 37 of a NOR gate 38, another input 39 of gate 38 is connected to the "T3" timing pulse 40. Output 41 of gate 38 is connected to memory clock right input 29CR and through an inverter 42 to a clock input 43t1 of a first half of a dual D type flip-flop 43 type CD4013C. An "A greater than B" output, 21G, is connected to data input 43d1 and to one input, 44, of an exclusive OR gate 45. An inverted output 43Q1 is connected to a second input 46 of gate 45. Output 47 of gate 45 is connected to memory mode input, 29MO. Set and reset inputs 43s1 and 43r1 are both connected to "OV", 49. A line 40, the "T3" timing pulse input, is connected through an inverter, 50, to a reset input 43r2. Timing pulse "TC" 51 is connected to clock input 43t2 and to one input 52 of a NOR gate 53. The other input 54 of gate 53 is connected to an inverted output 43$\overline{Q}$2. 43d2, the second data input of 43 is connected to OV,49. Output 55 of gate 53 is connected to the clock left memory input 29CL.

An "A equals B" output 23E is connected through an inverter 56 to one input 57 of a three input NAND gate 58. An "A less than B" output 23L is connected to one input 59 of a NAND gate 60. A second input, 61 of gate 60 is connected to a "A less than B" output, 27L. An "A greater than B" output, 23G, is connected to one input 62 of the NAND gate, 63. The other input 64 of gate 63 is connected to "A greater than B" output 27G. Output 65 of gate 63 is connected to input 66 of gate 58 and output 67 of gate 60 is connected to input 68 of gate 58. Output 69 of gate 58 is connected to the set input 43S2 and the range pair indicator (R) 70.

FIG. 4 is a detailed diagram of the memory block 29, and the domain counter and memory. The PA-PD inputs, lines 28, are connected individually to memory serial inputs S of four similar memory elements 71 through 74. The memory clock right CR input, line 41, is connected to the r inputs of all memory elements 71 through 80; the memory clock left CL input, line 55, is connected to the l inputs of all the memory elements 71 through 80 and the memory mode input MO, line 47 is connected to the m input of all the memory elements 71 through 80. The B outputs of the memory elements 71 through 80 are the RP outputs of the memory, 30. The A outputs of the memory elements are the R outputs of the memory, lines 81.

A domain counter 82 is formed of two CD4029C's 83 and 84 configured as a synchronous up counter. The "jam" inputs 85 of counter 82 are connected to the OV line, 49. The preset inputs 83p and 84p are connected to the SD (Set Domain) input 86. The "TD" input, 87 is connected to both clock inputs 83t and 84t. Outputs 88 of counter 83 are connected to the S inputs of memory elements 77 through 80 and the outputs 89 of counter 84 are connected to the S inputs of memory elements 75 and 76. Outputs 90 of counter 84 are not used and left open circuits.

FIG. 5 is a detail circuit of one of the similar memory elements 71 through 80. Circuits 91,92,93 and 94 are left/right shift registers type MM74C95. All the mode inputs m are joined together as are all the clock left, l, and the clock right "r", inputs of registers 91 through 94. The serial input 91S is connected to the memory element input, S. The A and B outputs of the memory elements are 91A and 91B respectively. Output C is connected to input, a, and output D is connected to input, b, on all registers 91 through 94. Output 91D is connected to input 92s, 92D to 93s and 93D to 94s. Output 94A is connected to input 93c, 93A to 92c and 92A to 91c. Output 94B is connected to input 93d, 93B to 92d and 92B to 91c. Inputs 94c and 94d are both connected to OV, 49.

FIG. 6 is the circuit of the differential domain generator. The "DP", domain penultimate outputs, 95 of memory elements 75 through 80 are connected through inverters, 96 through 101, to the "B" inputs 102 of two adders 103 and 104, both type CD4008C, configured as a 6 bit adder, 105.

A last domain output "D", 106 is connected to the A inputs of adder 105. Outputs 108 of the adder 105 are connected to inputs, 109, of two registers, 110 and 111, both type MM74C95, configured as an 8 bit parallel in/parallel out register 112. Clock left inputs 1101 and 1111 of register 112 are connected to memory clock left input CL. Output "DD", differential domain 113 is the main signal output of the analyser. Output 111C is used to indicate sign (or validity, S) of the "DD" output signal 113.

FIG. 7 shows the timing circuit diagram. A clock source 114 is connected to the clock input 115t of 115, type CD4029C configured as an up binary counter. 114 is also connected to input 16 of the NAND gate 117 the other input 118 of gate 117 is connected to output 115D. Output, 51, of 117 is the "TC" timing pulse. Output 115K, is the "TD" timing pulse, 87 and is also used to control a sampling rate of the analogue to digital converter. Outputs 119 of counter 115 are connected to inputs 120 of a BCD to decimal decoder, 121, type CD4028C. The "1" output, 34, of decoder 121 is the "T0" timing pulse and the "3" output, 35 of 121 is a "T1" timing pulse. The "4" output, 122, of decoder 121 is connected through inverter 123 to the "T2" timing pulse line, 36. Similarly the "6" output 124 of decoder 121 is connected to the "T3" timing pulse line, 40, through inverter 125.

The analysis performed by the embodiments is achieved by a series of events in a chronological sequence. This sequence is initiated by "T0" timing pulse, 34, which registers a number at the output 17 of counter 16 which is applied to the input 18 of register 19 by presetting 19p. This transfers the number at 17 to 24, the output of register 19. This number remains at 24 until the next "T0" timing pulse, 34.

The next pulse in the sequence is the "T1" timing pulse, 35 (see FIG. 8) which presets 16 through 16p. This transfers the number at the input 14 which is applied to the "jam" inputs 15 of 16 to the output 17. This number remains at 17 until the next "T1", timing pulse, 35. Output 17 is the new input number and output, 24, is the previous input number. These are compared by the magnitude comparator, 21 as 17 is applied to the "A" input, 20 and 24 is applied to the "B" input 25. If the number on the "A" input, 20, is less than the number on the "B" input 25, then the 21L output will be a logical "1" level (true). This logical level is inverted by 33 so that a logical "0" level (false) is applied to the enable input, 16k. This logical "0" level enable the counter, 16, to increment when clocked at 16t by the "T2" timing pulse 36 which occurs after 35. If, however, the number on the "A" input 20, is not less than the number on the "B" input, 25, then the 21L output will be a logical "0" level. After inversion by 33 the resulting logical "1" level applied to 16K inhibits 16 from incrementing when "T2", 36 occurs. Hence the number at 17 will be incremented by 1 if the new number 17 is less than the previous number 24. After "T2" pulse terminates, because "T0", "T1" and "T2" occur only once in each sequence the new number at 17 and the previous number at 24 remain unchanged for the rest of the sequence. Previous number 43$\overline{Q}$1 contains the previous logical level of 21G inverted. As the outputs of 43$\overline{Q}$1 and 21G are applied to the inputs of the exclusive OR gate 45 the output 47 will be a logical "1" if 21G and 43$\overline{Q}$1 are different (i.e. 21G and the previous 21G logical levels are the same). This switches all the mode inputs "m" of the shift registers 91 through 94 in all the memory elements 71 through 80 into the shift left mode which inhibits any attempt to clock right these shift registers.

On the other hand if 21G and 43$\overline{Q}$1 are the same (i.e. 21G and the previous 21G logical levels are different) then the output 47 of the exclusive OR gate 45 will be a logical "0". This output switches all the mode inputs "m" of the shift registers 91 through 94 in all the memory elements 71 through 80 into the shift right mode so that the memory will respond to a clock right pulse.

If the new number applied to inputs 20 is not equal to the previous number applied to inputs 25 then 21E will be at a logical "0" which, applied to 37 allows the "T3" timing pulse, 40, to be inverted by the OR gate, 38. The output 41 of 38 is used as a clock right pulse to "r" of all the shift registers 91 through 94 in all the memory elements 71 through 80. If the output 47 is a logical "1" then nothing will happen. If, however, there has been a change in direction of the number sequence at 17 which means that 21G and the previous 21G are different then the output 47 will be a logical "0" and the memory will shift right on the leading edge of the "T3" timing pulse. The previous number at 24 is applied to the "P" inputs 28 of the memory 29 and will be right shifted into the memory elements 71 through 74 to become the last number in the memory, available at the outputs 81. The previous last number in the memory becomes the penultimate number in the memory, at the outputs 30. Similarly the number in the domain counter 82, on lines 88 and 89, which is applied to the "s" inputs of memory elements 75 through 80, will be right shifted into the memory elements 75 through 80 and will become the last domain number "D" in memory at 106. The previous last domain number "D" is simultaneously shifted to the penultimate "DP" position in memory 75–80 and becomes the number on the "DP" output, 95. The number at 95 is inverted by inverters 96 through 100 and applied to the "B" inputs of the adder 105 so that a subtraction is performed between the "DP" number at 95 and the D number at 106 which is applied to the "A" inputs 107 of the adder 105. The adder output number on lines 108 is applied as the input to the register 112. The number will not be transferred to the register outputs 113, however, until a range pair has been found.

If the new number applied to inputs 20 of comparator 21 and the previous number applied to inputs 25 of comparator 21 are equal then 21E is a logical "1" level. This level applied to input 37 of NOR gate 38 inhibits the action of the other input 33 so that no shift right pulse is obtained at 41, the output of the NOR gate, 38. No shift right pulse is given, therefore, if the new number at 17 is equal to the previous number at 24. The output 41 of gate 38 is inverted by 42 so that 43 is clocked at 43+1 by the trailing edge of the timing pulse "T3" if the output 21E is a logical "0". This transfers and inverts the input logical level at 43D1 to the output 43Q1. After "T3" has finished, therefore, the inputs 44 and 46 of gate 45 are at different logical levels so that the output, 47 of gate 45 is at a logical "1" level and therefore the memory shift registers 91 through 94 of all memory elements 71 through 80 are all in the shift left mode for the remainder of the sequence.

The timing pulse "T3" is inverted by circuit 50 and resets the second half of flip-flop 43 through 43r2. This ensures that no range pairs are erroneously indicated due to the original new number at 17 before correction by timing pulse "T2"

After the timing pulse "T3" a series of eight "TC" pulses are produced by the NAND gate 117. These "TC" pulses applied to input 52 of 53 produce clock left pulses at the "1" inputs of the memory shift registers, 91 through 94, of all the memory elements, 71 through 80, if 43$\overline{Q}$2 is a logical "0". If the output 43$\overline{Q}$2 is a logical "1", then the output, 55, of gate 53 is a logical "0", irrespective of the "TC" logical input level at 52.

When the memory shift registers, 91 through 94 receive a pulse from output 55 of gate 53 at the "1" inputs the numbers in the shift registers are shifted two places left because of the external connections being made two places along (output "C" is connected to input "A" etc.) For each memory element, 71 through 80, the outputs 91A and 91B are lost from the shift register and replaced by previous outputs 91C and 91D. The outputs 91C and 91D are replaced by previous outputs 92A and 92B. The input to 94c and 94d is a logical 0 level so that the number 0 is set into the outputs 94C and 94D.

A clock left pulse to the memory is also applied to the "1" inputs of registers 110 and 111, which transfers a number applied to the inputs, 109 of the shift register 112, to outputs 113 and the sign output 111C.

A range pair is detected by a logical analysis of the outputs of the two magnitude comparators 23 and 27. The penultimate number, 30, in the memory elements 71 through 74 is applied to the "A" inputs, 31, of comparator 23 and the "B" inputs 32 of comparator 27. As the previous number 24 is applied to the "A" inputs 26 of comparator 27 and the new number 17 is applied to the "B" inputs, 22, of comparator 23, a comparison is made between the new number at 17 and the "RP" number in the penultimate position, 30, of the memory 29, and a comparison is simultaneously made between the number at outputs 30 and the previous number at 24. If the new number at 17 is equal to the "RP" number at 30 then the output 23E becomes a logical "1". This logical level is inverted by circuit 56 and, applied to input 57 of gate 58 causes output 69 to become a logical "1" level. If the new number at 17 is less than the "RP" number at 30 then 23G will be a logical "1" and if at the same time the previous number at 24 is greater than the "RP" number at 30 then 27G will be a logical "1", so that both inputs, 62 and 64, of gate 63 will be logical "1" causing the output, 65, of gate 63 to be a logical "0" and hence, through the input 66, cause the NAND gate 58 to have a logical "1" output. Similarly, if the new number at 17 is greater than the "RP" number at 30 then 23L will be a logical "1" and if at the same time the previous number at 24 is less than the "RP" number at 30 then 27L will be a logical "1", so that both inputs 59 and 61, of NAND gate 60 will be a logical "1" causing output 67 and, therefore, input 68 of gate 58 to be a logical "0". Hence output 69 will be a logical "1". Under any other conditions output 69 will be a logical "0".

A logical "1" on output, 69, of gate 58 indicates that a range pair has been found. This output is used to set 43$\overline{Q}$2 to a "0" through input 43s2 so that NOR gate 53 is enabled and a clock left pulses shift the memory registers. As the memory 29 is clocked the "RP" number at 30 will change. When there are no more range pairs in memory, 29 then the conditions which cause output 69 of 58 to be a logical "1" will not be fulfilled and 69 will become a logical "0". This logical "0" applied to 43s2 enables the noraml clock input 43t2 to operate so that on the next positive going edge in the series of "TC" pulses sets the logical level "0" applied to 43d2, inverted, into the output 43$\overline{Q}$2. This logical "1" level, applied to input 54 inhibits any more shift left pulses from the output 55 of gate 53 until range pairs are detected in a later sequence.

At the end of each sequence a "TD" pulse is created by the sequence counter 115. This pulse is used to increment the domain counter, 82. It may also be used to synchronise the sampling rate of the analogue to digital conversion process if a common timing source is not used. A timing source 114 of common type (multivibrator, crystal controlled oscillator or any external clock source may be used) clocks the sequence counter through 115t causing counter 115 to count. The sequence selector inputs 120 are controlled by the number at the outputs 119 of the sequence counter 115. The logical "1" input applied to 121d when the sequence number at 119 is greater than 7 inhibits the sequence selector outputs, but enables the NAND gate 117 to produce a series of eight "TC" pulses during the second half of each sequence.

During the first half of each sequence the sequence selector is enabled and produces a positive pulse from an output selected according to the number at the outputs 119 of the sequence counter 115. Hence the "T0" timing pulse occurs (34 is a logical "1" level) when the sequence number is "1"; the "T1" timing pulse occurs (35 is a logical "1" level) when the sequence number is "3". When the sequence number is "4" then output 122 is a logical "1" level. However this is inverted by circuit 123 to produce pulse "T2" on line 36, hence line 36 is normally at a logical "1" level except when the sequence number is "4" when it becomes a logical "0". Similarly when the sequence number is 6 output, 124, is a logical "1", therefore, the output 40 of the inverter, 125, produces the negative logical "T3" timing pulse.

A domain "SD" is normally logical "0" but may be set to a logical "1" level to set the domain counter, 82 to "0" on all outputs.

Thus it will be seen to those familiar with this art that the method of the invention provides a powerful tool for signal analysis.

I claim:

1. A method of analysis of a signal which includes a succession of turning points, comprising the following steps:
    A. establishing a series of discrete range values for the signal to be analyzed;
    B. storing information identifying the discrete range value for each successive turning point, in association with a domain value for that turning point, in a turning point memory;
    C. continuously comparing the penultimate stored turning point range value with the present range value of the input signal;
    D. upon detection of a range value equality in step C, storing a range pair constituting the ultimate stored turning point range value and the penultimate stored turning point range value, in a range pair memory;
    E. concurrently with recording of the range pair, in step D, storing a domain pair constituting the domain values associated with the ultimate and penultimate stored turning point range values, in a domain pair memory;
    F. removing the turning point range values relating to the range pair from subsequent comparison; and
    G. continuing the foregoing procedure for each turning point and range pair in the input signal.

2. A method of signal analysis as in claim 1 including the further step of:
    E'. measuring the difference between the domain values of each domain pair associated with each range pair and storing a value corresponding to that difference in a domain pair difference memory.

3. A method of signal analysis as in claim 1 or claim 12 wherein the range pair memory is of a type in which the range values are retained in a last in first out basis.

4. A method of signal analysis as in claim 3 in which the domain pair memory is of a type in which the domain values are retained in a last in first out basis and such domain values are entered and withdrawn synchronously with the entry and withdrawal of associated range values in the range pair memory.

5. A method of signal analysis as in claim 1 including the further step of:
    C'. incrementing the range value of the signal being analysed by a range value of one for each decreasing range value of that signal.

6. A method of signal analysis as in claim 1 including the further step of:
    C". decrementing the range value of the signal being analysed by a range value of one for each increasing range value of that signal.

7. A method of signal analysis as in claim 1 in which the range values of the signal analyzed constitute variations in the amplitude of that signal.

8. A method of signal analysis as in claim 1 in which the domain values of the signal analyzed constitute time reference values.

9. A method for analyzing a series of events having a plurality of levels for occurrence, comprising the following steps:
    A. associating signal vectors with the occurrence of events at said plurality of levels;
    B. detecting extrema in the signal vectors;
    C. establishing a domain value for each of such extrema in the signal vectors;
    D. recording each of the extrema, together with its domain value, in a LIFO memory;
    E. detecting each occurrence of a signal vector equal to the penultimate recorded extremum vector; and
    F. upon detection of an equality in step D, recording a subset comprising said penultimate extremum vector and an immediately adjacent extremum vector from the LIFO memory, and their domain values, in an additional memory, and deleting that subset from the LIFO memory.

10. Apparatus for analyzing a series of events having a plurality of levels of occurrence comprising:
    signal means for developing an event signal having discrete amplitude levels indicative of occurrence levels for said events;
    domain means for developing a continuing series of domain signals;
    means for detecting extrema in the levels of the event signal;
    recording means, comprising a LIFO memory, for recording said extrema, each in association with the concurrent domain signal;
    equality detector means, coupled to the recording means and the signal means, for detecting the occurrence of an equality between the penultimate recorded extremum and the present level of the event signal;
    utilization means, connected to the equality detection means and to the recording means, for extracting the last two event signal extrema and their associated domain signals from the memory upon detection of an equality;
    and means for deleting the extracted signals from the memory.

* * * * *